(12) United States Patent
Wu et al.

(10) Patent No.: US 8,982,919 B2
(45) Date of Patent: Mar. 17, 2015

(54) LASER LIGHT SOURCE MODULE, LASER APPARATUS AND LIGHTING METHOD THEREFOR

(71) Applicant: Delta Electronics, Inc., Taoyuan Hsien (TW)

(72) Inventors: Kuo-Tung Wu, Taoyuan Hsien (TW); Chung-Han Huang, Taoyuan Hsien (TW); Tung-Chin Wu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 135 days.

(21) Appl. No.: 13/761,515

(22) Filed: Feb. 7, 2013

(65) Prior Publication Data

US 2013/0301665 A1  Nov. 14, 2013

(30) Foreign Application Priority Data

May 9, 2012 (TW) .............................. 101116562 A

(51) Int. Cl.
*H01S 3/09* (2006.01)
*H01S 5/068* (2006.01)
*H04N 9/31* (2006.01)

(52) U.S. Cl.
CPC .............. *H01S 3/09* (2013.01); *H01S 5/06825* (2013.01); *H04N 9/3161* (2013.01)
USPC ..................................... 372/38.03; 372/38.02

(58) Field of Classification Search
CPC ... H01S 3/09; H01S 5/06825; H01S 5/06808; H01S 5/06812; H01S 5/0683
USPC ......................................................... 372/38.03
See application file for complete search history.

(56) References Cited

U.S. PATENT DOCUMENTS

2004/0258106 A1* 12/2004 Araujo et al. ..................... 372/9
2007/0242709 A1* 10/2007 Tan et al. ......................... 372/30

FOREIGN PATENT DOCUMENTS

TW           M422264           2/2012

* cited by examiner

*Primary Examiner* — Xinning Niu
(74) *Attorney, Agent, or Firm* — Kirton McConkie; Evan R. Witt

(57) ABSTRACT

A laser light source module includes a laser source, a connecting unit, a controlled switch unit, and a verification unit. When a verification signal is received, the verification unit judges whether the verification signal complies with a verifying condition. If the verification signal complies with the verifying condition, the controlled switch unit is in the on state, so that a first output voltage is transmitted to the laser source through the controlled switch unit to drive illumination of the laser source. Whereas, if the verification signal does not comply with the verifying condition, the controlled switch unit is in the off state, so that the first output voltage fails to be transmitted to the laser source through the controlled switch unit and the laser source is turned off.

16 Claims, 5 Drawing Sheets

LASER LIGHT SOURCE MODULE, LASER APPARATUS AND LIGHTING METHOD THEREFOR

FIELD OF THE INVENTION

The present invention relates to a laser light source module, and more particularly to a laser light source module with a safe protection mechanism. The present invention relates to a laser apparatus having the laser light source module and a lighting method of the laser light source module.

BACKGROUND OF THE INVENTION

A laser apparatus has high efficiency, long life cycle and good beam quality. Consequently, the laser apparatus is widely used in many fields such as electronics technologies, multimedia information technologies, communication technologies, biotechnologies, medical health technologies, and the like.

Generally, the laser apparatus (e.g. a laser projector) has a laser light source module. During operations of the laser projector, a laser diode of the laser light source module emits laser beams. Moreover, the laser light source module is usually detachably assembled into the laser apparatus. In a case that the laser diode of the laser light source module is damaged, the laser light source module may be detached from the laser apparatus in order to be replaced with a new one. After the laser light source module is detached from the laser apparatus, the driving power fails to be transmitted from the laser apparatus to the laser light source module. Consequently, the laser light source module is turned off.

As known, if the light beams emitted by the laser diode are directly projected onto the human's eyes, the eyes may be suffered from serious damage. Moreover, after the laser light source module is detached from the laser apparatus, there is no protection mechanism to protect the laser light source module. If the laser light source module is connected with an external power source because of curiosity or any other reason, the laser light source module may emit light beams. However, since the light beams are possibly projected onto the human's eyes, the eyes may be suffered from serious damage. Under this circumstance, the risk of using the laser light source module or the laser apparatus will be increased.

Therefore, there is a need of providing a laser light source module with a safe protection mechanism in order to eliminate the above drawbacks.

SUMMARY OF THE INVENTION

The present invention provides a laser light source module, a laser apparatus having the laser light source module, and a lighting method of the laser light source module. The laser light source module has a safe protection mechanism. After the laser light source module is detached from the laser apparatus, the laser light source module fails to be enabled to emit the light beams. As a consequence, the risk of using the laser light source module or the laser apparatus will be largely reduced.

In accordance with an aspect of the present invention, there is provided a laser light source module. The laser light source module is detachably assembled into a laser apparatus. The light source module includes a laser source, a connecting unit, a controlled switch unit, and a verification unit. The connecting unit is used for receiving electric power required to operate the laser light source module. The connecting unit includes a first power-receiving port and a signal-receiving port. The controlled switch unit has a conducting terminal electrically connected between the laser source and the first power-receiving port. The verification unit is electrically connected with a control terminal of the controlled switch unit, the connecting unit and the signal-receiving port, and stores a predetermined verifying condition. When a verification signal is received by the signal-receiving port, the verification unit judges whether the verification signal complies with the verifying condition, thereby determining on/off states of the controlled switch unit. If the verification signal complies with the verifying condition, the controlled switch unit is controlled by the verification unit to be in the on state, so that a first output voltage from the first power-receiving port is transmitted to the laser source through the controlled switch unit to drive illumination of the laser source. Whereas, if the verification signal does not comply with the verifying condition, the controlled switch unit is controlled by the verification unit to be in the off state, so that the first output voltage fails to be transmitted to the laser source through the controlled switch unit and the laser source is turned off.

In accordance with another aspect of the present invention, there is provided a laser apparatus. The laser apparatus includes a driving circuit and a laser light source module. The driving circuit is used for converting an input voltage into plural output voltages, and outputting a verification signal. The laser light source module is powered and operated by the plural output voltages. The laser light source module includes a laser source, a connecting unit, a controlled switch unit, and a verification unit. The connecting unit is detachably assembled into the driving circuit. The connecting unit includes a first power-receiving port for receiving a first output voltage of the plural output voltages and a signal-receiving port for receiving the verification signal. The controlled switch unit has a conducting terminal electrically connected between the laser source and the first power-receiving port. The verification unit is electrically connected with a control terminal of the controlled switch unit, the connecting unit and the signal-receiving port, and storing a predetermined verifying condition. When a verification signal is received by the signal-receiving port, the verification unit judges whether the verification signal complies with the verifying condition, thereby determining on/off states of the controlled switch unit. If the verification signal complies with the verifying condition, the controlled switch unit is controlled by the verification unit to be in the on state, so that a first output voltage from the first power-receiving port is transmitted to the laser source through the controlled switch unit to drive illumination of the laser source. Whereas, if the verification signal does not comply with the verifying condition, the controlled switch unit is controlled by the verification unit to be in the off state, so that the first output voltage fails to be transmitted to the laser source through the controlled switch unit and the laser source is turned off.

In accordance with a further aspect of the present invention, there is provided a lighting method of a laser light source module. The laser light source module includes a laser source, a connecting unit, a controlled switch unit and a verification unit. The connecting unit includes a first power-receiving port and a signal-receiving port. The controlled switch unit has a conducting terminal electrically connected between the laser source and the first power-receiving port. The verification unit is electrically connected with a control terminal of the controlled switch unit, the connecting unit and the signal-receiving port. The verification unit stores a predetermined verifying condition. The lighting method includes steps of: (a) receiving electric power required to operate the laser light source module through the connecting unit, (b) allowing the verification unit to judge whether a verification signal received by the connecting unit complies with the verifying condition, and (c) determining on/off states of the controlled switch unit. If the verification signal complies with the verifying condition, the controlled switch unit is controlled by the verification unit to be in the on state, so that the electric power from the connecting port is transmitted to the laser source through the controlled switch unit to turn on the laser source.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
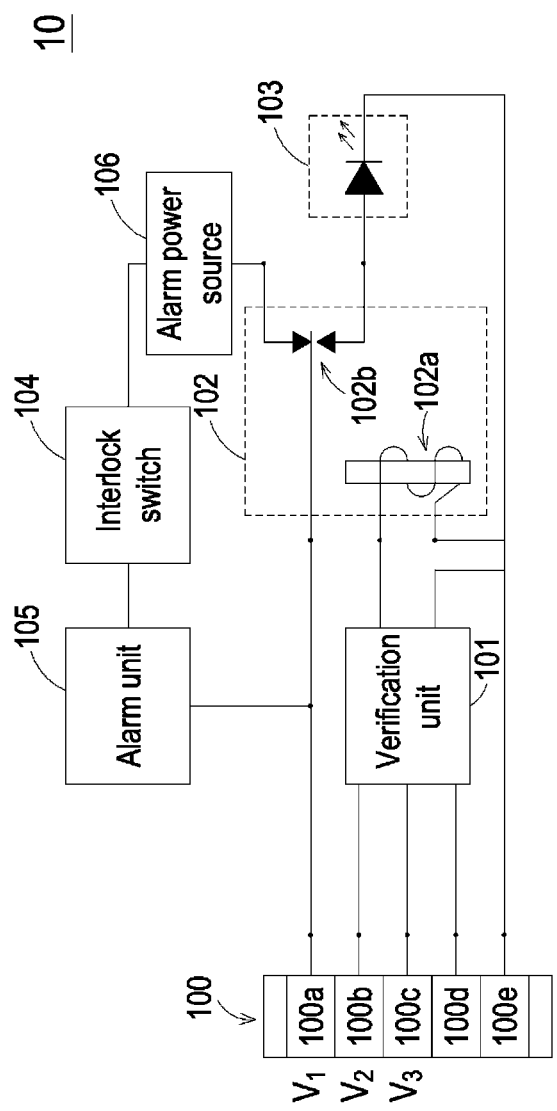
FIG. 1 is a schematic circuit diagram illustrating a laser light source module according to an embodiment of the present invention.
Figure 2:
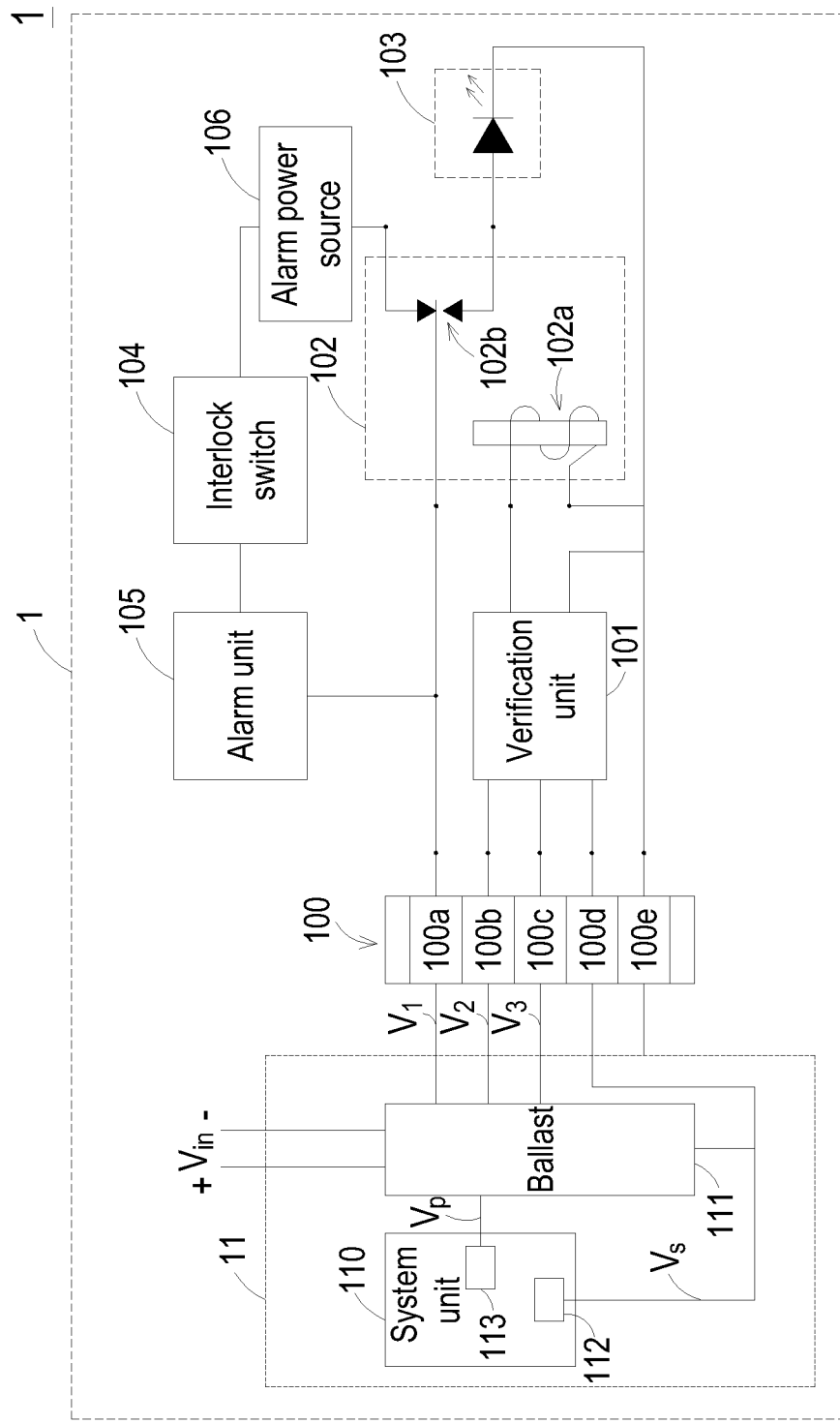
FIG. 2 is a schematic circuit diagram illustrating a laser apparatus with the laser light source module of FIG. 1.

FIG. 1 is a schematic circuit diagram illustrating a laser light source module according to an embodiment of the present invention. FIG. 2 is a schematic circuit diagram illustrating a laser apparatus with the laser light source module of FIG. 1. Please refer to FIGS. 1 and 2. The laser light source module 10 is detachably assembled into a laser apparatus 1. For example, the laser apparatus 1 is a laser projector. The laser light source module 10 comprises a connecting unit 100, a verification unit 101, a controlled switch unit 102, and at least one laser source 103. In an embodiment, the laser source 103 is a single light emitting diode (LED). Alternatively, the laser source 103 comprises plural light emitting diodes, which are connected with each other in series.

An example of the connecting unit 100 includes but is not limited to an electric connector. The connecting unit 100 is detachably assembled into a driving circuit 11 of the laser projector 1. After the connecting unit 100 is connected with the driving circuit 11, the electric power may be transmitted from the driving circuit 11 to the laser light source module 10 through the connecting unit 100. The connecting unit 100 comprises plural power-receiving ports (e.g. the power-receiving ports 100a, 100b and 100c) and a signal-receiving port 100d. The electric power (e.g. a first output voltage $V_1$) for powering the laser source 103 is received by the first power-receiving port 100a. The electric power (e.g. a second output voltage $V_2$) for powering the verification unit 101 is received by the second power-receiving port 100b. The electric power (e.g. a third output voltage $V_3$) for powering the controlled switch unit 102 is received by the third power-receiving port 100c. The signal-receiving port 100d is used for receiving a verification signal from the driving circuit 11 of the laser projector 1.

The control terminal 102a of the controlled switch unit 102 is electrically connected with the verification unit 101. The conducting terminal 102b of the controlled switch unit 102 is electrically connected between the first power-receiving port 100a of the connecting unit 100 and the laser source 103. The on/off states of the controlled switch unit 102 are controlled by the verification unit 101, so that the path between the first power-receiving port 100a and the laser source 103 is selectively conducted or interrupted.

In an embodiment, the controlled switch unit 102 is a relay. That is, the control terminal 102a of the controlled switch unit 102 is a coil assembly, and the conducting terminal 102b of the controlled switch unit 102 is a circuit contact assembly. In some other embodiments, the controlled switch unit 102 is a metal-oxide-semiconductor field-effect transistor. The gate terminal of the metal-oxide-semiconductor field-effect transistor is the control terminal 102a of the controlled switch unit 102, which is electrically connected with the verification unit 101. The source terminal and the drain terminal of the metal-oxide-semiconductor field-effect transistor are collectively defined as the conducting terminal 102b of the controlled switch unit 102, which is electrically connected between the first power-receiving port 100a of the connecting unit 100 and the laser source 103.

An example of the verification unit 101 includes but is not limited to a decoder. The verification unit 101 is electrically connected with the control terminal 102a of the controlled switch unit 102, the second power-receiving port 100b, the third power-receiving port 100c and the signal-receiving port 100d. The verification unit 101 is driven by the electrical power from the second power-receiving port 100b (e.g. the second output voltage $V_2$). A verifying condition corresponding to the form or the type of the verification signal from the signal-receiving port 100d has been previously stored into the verification unit 101. According to the verification signal from the signal-receiving port 100d, the verification unit 101 will judge whether the verification signal complies with the verifying condition, thereby determining the on/off states of the controlled switch unit 102. In a case that the verification signal complies with the verifying condition, the controlled switch unit 102 is controlled by the verification unit 101 to be in the on state. Consequently, the third output voltage $V_3$ for powering the controlled switch unit 102 is transmitted to the control terminal 102a of the controlled switch unit 102. Meanwhile, the first output voltage $V_1$ from the first power-receiving port 100a is transmitted to the laser source 103 through the on-state controlled switch unit 102. Under this circumstance, the laser source 103 emits light beams.

On the other hand, if the verification signal is not received by the signal-receiving port 100d or the verification signal fails to comply with the verifying condition, the controlled switch unit 102 is controlled by the verification unit 101 to be in the off state. Consequently, the third output voltage $V_3$ for powering the controlled switch unit 102 fails to be transmitted to the control terminal 102a of the controlled switch unit 102. Since the first output voltage $V_1$ from the first power-receiving port 100a fails to be transmitted to the laser source 103 through the off-state controlled switch unit 102, the laser source 103 is turned off.

From the above discussions, when the verification signal is received by the signal-receiving port 100d and the verification signal complies with the verifying condition, the controlled switch unit 102 of the laser light source module 10 is conducted. After the controlled switch unit 102 is conducted, the electric power from the first power-receiving port 100a is transmitted to the laser source 103, so that the laser source 103 emits light beams. In accordance with the present invention, the verification signal complying with the verifying condition is generated by the driving circuit 11 of the laser projector 1, and it is difficult to simulate the verification signal by the user and input the verification signal to the power-receiving port 100d. In a case that the laser light source module 10 is detached from the laser apparatus and an external power source is connected with the power-receiving ports 100a, 100b and 100c of the connecting unit 100, the verification signal complying with the verifying condition fails to be received by the power-receiving port 100d of the connecting unit 100. Since a failed verification result is detected by the verification unit 101, the electric power fails to be transmitted to the laser source 103 through the off-state controlled switch unit 102, and the laser source 103 is turned off. In other words, the laser light source module 10 of the present invention has a safe protection mechanism. After the laser light source module 10 is detached from the laser projector 1, the laser light source module 10 fails to be enabled to emit the light beams. As a consequence, the risk of using the laser light source module 10 or the laser projector will be largely reduced.

In this embodiment, the connecting unit 100 further comprises a ground port 100e. The ground port 100e is electrically connected with the verification unit 101, the controlled switch unit 102 and the laser source 103. Consequently, the verification unit 101, the controlled switch unit 102 and the laser source 103 are connected with ground through the ground port 100e.

In some embodiments, the laser light source module 10 further comprises an interlock switch 104, an alarm unit 105, and an alarm power source 106. The interlock switch 104, the alarm unit 105 and the alarm power source 106 are electrically connected with each other in series, and arranged between the controlled switch unit 102 and the connecting unit 100. For example, the interlock switch 104, the alarm unit 105 and the alarm power source 106 are electrically connected between the controlled switch unit 102 and the first power-receiving port 100a of the connecting unit 100. An example of the alarm unit 105 includes a light emitting diode, an audio device, or any other prompt-generating device. After the driving power from the alarm power source 106 is received by the alarm unit 105, the alarm unit 105 emits a warning signal (e.g. a light beam or a sound). An example of the alarm power source 106 includes but is not limited to a battery.

The interlock switch 104 is electrically connected between the alarm unit 105 and the alarm power source 106. An example of the interlock switch 104 includes but is not limited to a dome switch. The operation of the interlock switch 104 is correlated with the situation whether the laser light source module 10 is assembled into or detached from the laser projector 1. In a case that the laser light source module 10 is assembled into the laser projector 1, the interlock switch 104 is electrically connected with the laser projector 1, so that the interlock switch 104 is in an off state. Whereas, in a case that the laser light source module 10 is detached from the laser projector 1, the interlock switch 104 is disconnected from the laser projector 1, so that the interlock switch 104 is in an on state. Once the interlock switch 104 is in the on state, the driving power from the alarm power source 106 is transmitted to the alarm unit 105 through the interlock switch 104. Consequently, the alarm unit 105 emits a warning signal to prompt the user that the laser light source module 10 is detached from the laser projector 1.

In some embodiments, the connecting unit 100 is covered by a multi-layered plate (e.g. a four-layered plate) in order to shelter the inner components of the connecting unit 100 (e.g. the power-receiving ports 100a~100c, the signal-receiving port 100d, and the ground port 100e). In such way, the complexity of applying an external voltage and verification signal to the connecting unit 100 by the user will be increased. That is, even if the user realizes the circuitry of the laser light source module 10, it is difficult for the user to apply the external voltage to drive illumination of the laser light source module 10.

Please refer to FIG. 2 again. The driving circuit 11 of the laser projector 1 is electrically connected with the laser light source module 10 through the connecting unit 100. By the driving circuit 11, an input voltage $V_{in}$ (e.g. an AC voltage provided by an utility power source) is converted into the electric power required for the laser light source module 10. For example, the input voltage $V_{in}$ is converted into the first voltage $V_1$, the second voltage $V_2$ and the third voltage $V_3$. The first voltage $V_1$, the second voltage $V_2$ and the third voltage $V_3$ are transmitted to the first power-receiving port 100a, the second power-receiving port 100b and the third power-receiving port 100c, respectively. In addition, the driving circuit 11 further outputs a verification signal. In a case that the laser light source module 10 is assembled into the laser projector 1, the verification signal is transmitted to the signal-receiving port 100d of the connecting unit 100.

The driving circuit 11 comprises a system unit 110 and a ballast 111. Under control of the system unit 110, the input voltage $V_{in}$ is converted into the electric power required for the laser light source module 10 (e.g. the first voltage $V_1$, the second voltage $V_2$ and the third voltage $V_3$) by the ballast 111.

The system unit 110 is electrically connected with the ballast 111. The system unit 110 is used for starting the ballast 111 and controlling the operation of the ballast. Moreover, the system unit 110 comprises a GPIO (general purpose input output) interface 112 and a UART (universal asynchronous receiver/transmitter) interface 113. The GPIO interface 112 and the UART interface 113 are electrically connected with the ballast 111. The system unit 110 may issue a start signal $V_S$ to the ballast 111 through the GPIO interface 112 for determining whether the ballast 111 is started or not. Moreover, system unit 110 may issue an encoding signal $V_p$ with an encoding format to the ballast 111 through the UART interface 113. According to the encoding parameters contained in the encoding signal $V_p$, the operating status (e.g. the output power) of the ballast 111 is correspondingly controlled.

In the above embodiment, the start signal $V_S$ is switched between a high-level state and a low-level state. In a case that the start signal $V_S$ is in the high-level state, the ballast 111 is enabled. Whereas, in a case that the start signal $V_S$ is in the low-level state, the ballast 111 is disabled. The contents of the encoding format of the encoding signal $V_p$ may be previously set according to the practical requirements of the user.

Moreover, when the laser light source module 10 is electrically connected with the driving circuit 11, the GPIO interface 112 is further electrically connected with the signal-receiving port 100d. Consequently, the start signal $V_S$ may be transmitted to the signal-receiving port 100d through the GPIO interface 112. Under this circumstance, the start signal $V_S$ is acted as the verification signal, which is transmitted to the verification unit 101 through the signal-receiving port 100d. As mentioned above, the start signal $V_S$ is switched between the high-level state and the low-level state. Consequently, according to the settings, if the start signal $V_S$ in the high-level state is received by the verification unit 101, the verification result is successful. Whereas, if the start signal $V_S$ is not received by the verification unit 101, or if the start signal $V_S$ in the low-level state is received by the verification unit 101, the verification result is failed. After the verification result is detected, the subsequent actions of the laser light source module 10 that have been mentioned above will be done.

Figure 3:
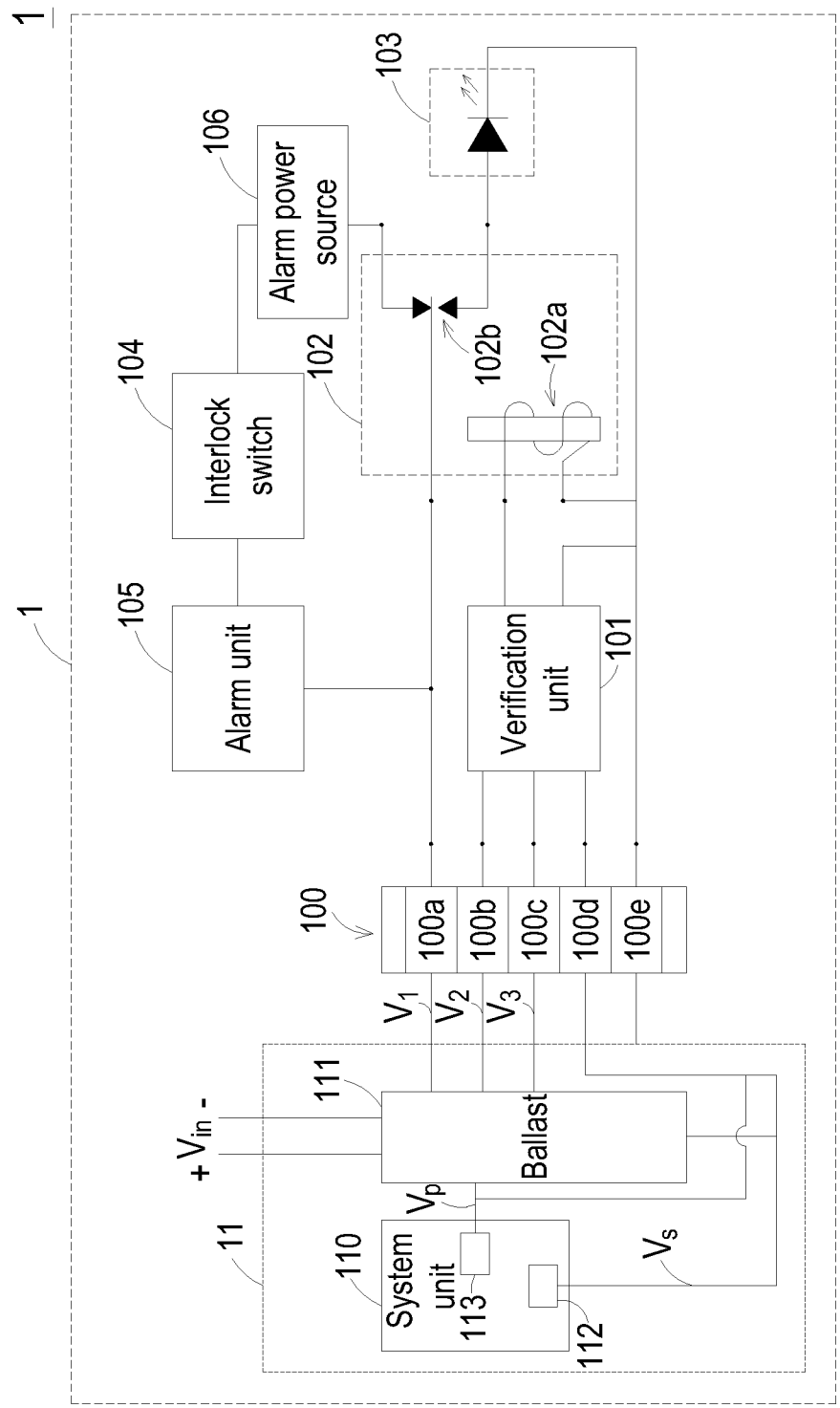
FIG. 3 is a schematic circuit diagram illustrating a variant example of the laser light source module of FIG. 2.

FIG. 3 is a schematic circuit diagram illustrating a variant example of the laser light source module of FIG. 2. In a case that the laser light source module 10 is electrically connected with the driving circuit 11, the GPIO interface 112 is electrically connected with the signal-receiving port 100d, and the UART interface 113 is also electrically connected with the signal-receiving port 100d. Consequently, the encoding signal $V_p$ is transmitted to the signal-receiving port 100d through the UART interface 113. Under this circumstance, the start signal $V_S$ and the encoding signal $V_p$ are collaboratively acted as the verification signal. As mentioned above, the start signal $V_S$ is switched between the high-level state and the low-level state. In addition, the encoding signal $V_p$ contains an encoded code. According to the settings, if the start signal $V_S$ in the high-level state is received by the verification unit 101 and the encoded code contained in the encoding signal $V_p$ is acceptable by the verification unit 101, the verification result is successful. Whereas, if the start signal $V_S$ is not received by the verification unit 101, if the start signal $V_S$ in the low-level state is received by the verification unit 101, or if the encoded code contained in the encoding signal $V_p$ is unacceptable by the verification unit 101, the verification result is failed. After the verification result is detected, the subsequent actions of the laser light source module 10 that have been mentioned above will be done.

Figure 4:
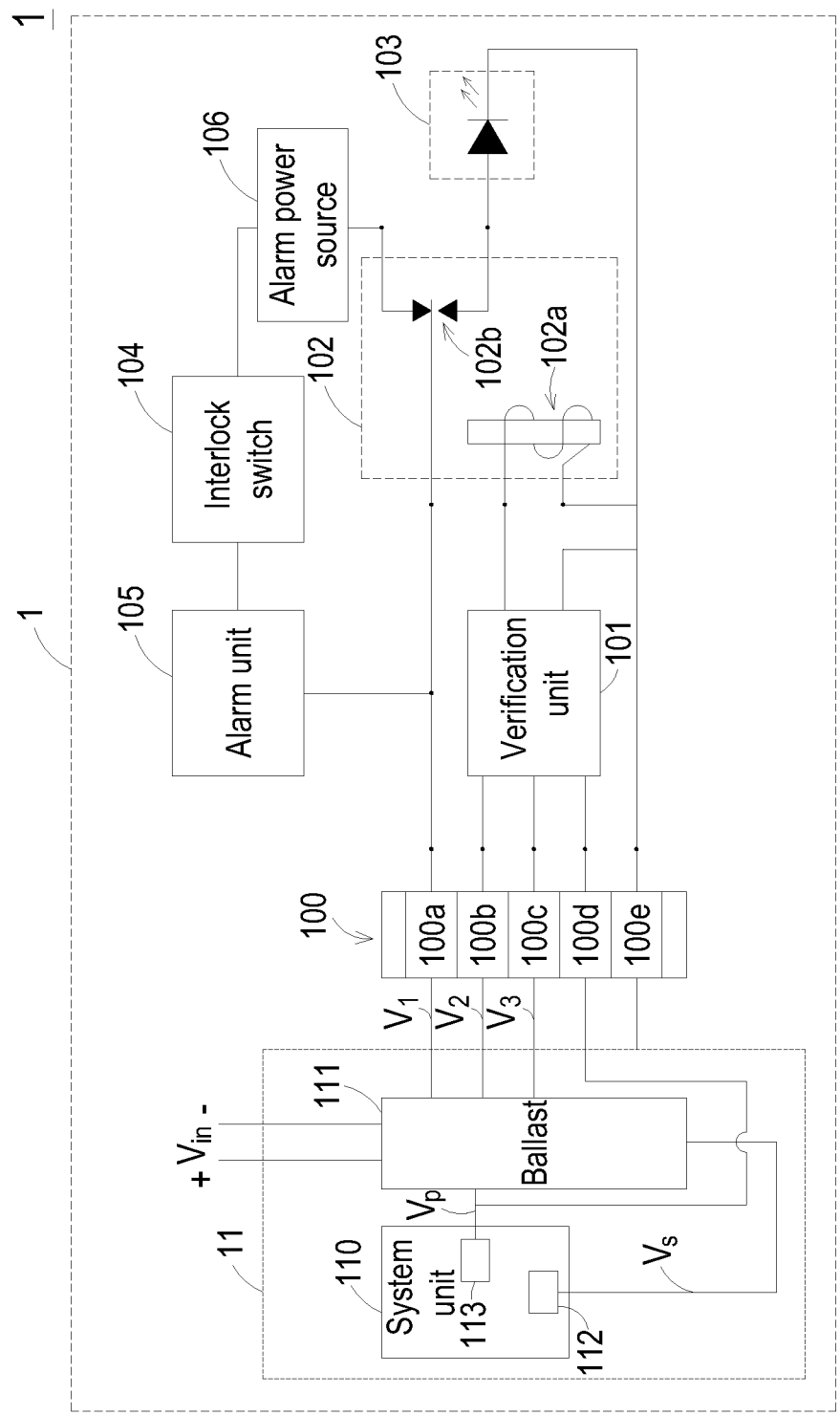
FIG. 4 is a schematic circuit diagram illustrating another variant example of the laser light source module of FIG. 2.

FIG. 4 is a schematic circuit diagram illustrating another variant example of the laser light source module of FIG. 2. In this embodiment, only the UART interface 113 is electrically connected with the signal-receiving port 100d, but the GPIO interface 112 is not electrically connected with the signal-receiving port 100d. In addition, the encoding signal $V_p$ contains an encoded code. According to the settings, if the encoded code contained in the encoding signal $V_p$ is acceptable by the verification unit 101, the verification result is successful. Whereas, if the encoded code contained in the encoding signal $V_p$ is not received by the verification unit 101, or if the encoded code contained in the encoding signal $V_p$ is unacceptable by the verification unit 101, the verification result is failed. After the verification result is detected, the subsequent actions of the laser light source module 10 that have been mentioned above will be done.

Hereinafter, the operations of the laser projector 1 will be illustrated with reference to FIG. 2. For example, in a case that the laser light source module 10 is detached from the laser projector 1 or the laser light source module 10 is erroneously assembled with the laser projector 1, the interlock switch 104 is in the on state, and thus the alarm unit 105 emits a warning signal to prompt the user. After the laser light source module 10 is assembled into the laser projector 1 and the laser projector 1 is turned on, the start signal $V_S$ in the high-level is issued from the system unit 110 to the ballast 111. Consequently, the ballast 111 is enabled, and the encoding signal $V_p$ is issued to the ballast 111. According to the encoding signal $V_p$, the input voltage $V_{in}$ is converted into the electric power required for the laser light source module 10 and the operating status of the laser light source module 10 is corresponding adjusted. In a case that the start signal $V_S$ in the high-level is received by the verification unit 101, the verification unit 101 will confirm that the verification signal complies with the verifying condition. Consequently, the verification unit 101 issues the third output voltage $V_3$ to the control terminal control terminal 102a of the controlled switch unit 102. Meanwhile, the first output voltage $V_1$ from the first power-receiving port 100a is transmitted to the laser source 103 through the on-state controlled switch unit 102. Under this circumstance, the laser source 103 emits light beams.

Figure 5:
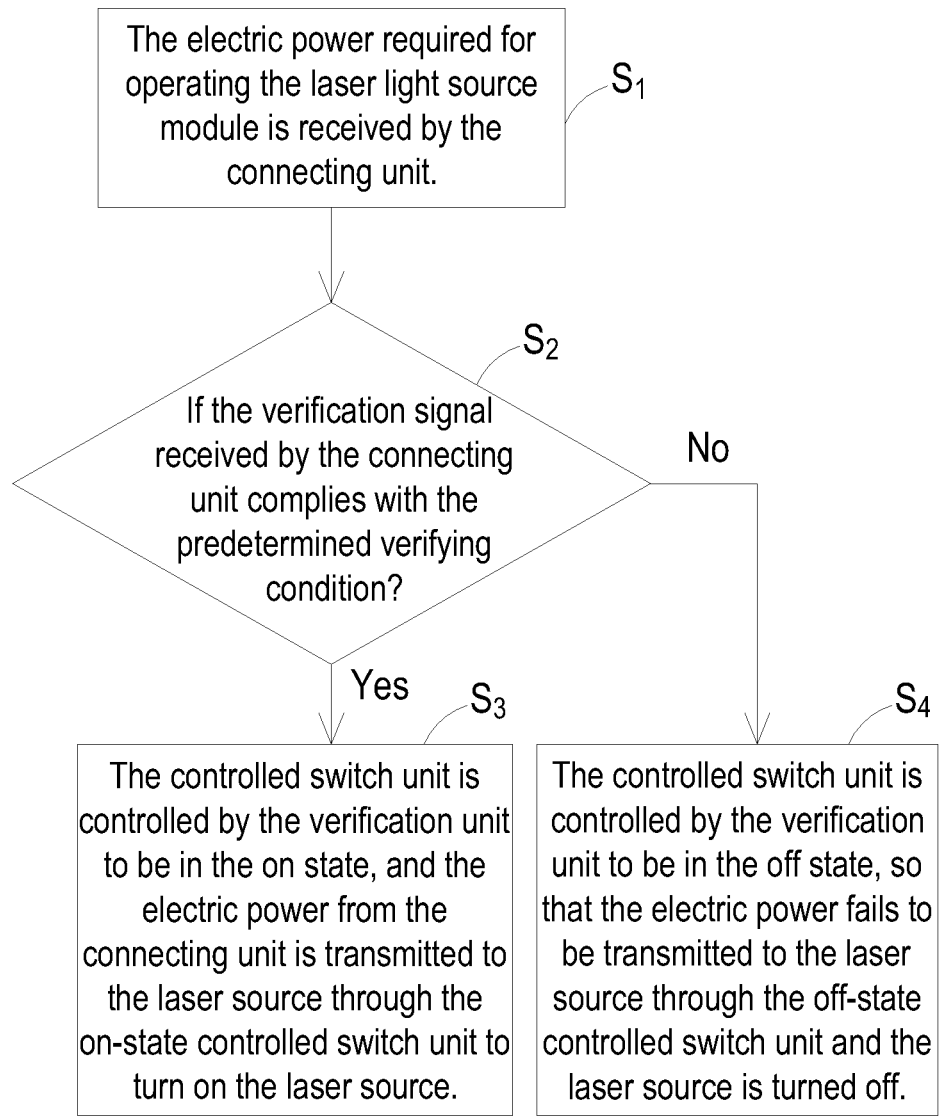
FIG. 5 is a flowchart illustrating a lighting method of the laser light source module according to an embodiment of the present invention.

Hereinafter, a lighting method of the laser light source module of the present invention will be illustrated with reference to the configurations of FIG. 1 and the flowchart of FIG. 5. Firstly, the electric power required for operating the laser light source module 10 is received by the connecting unit 100 (Step S1). Then, the verification unit 101 will judge whether the verification signal received by the connecting unit 100 complies with the predetermined verifying condition (Step S2). If the verification signal complies with the predetermined verifying condition, the controlled switch unit 102 is controlled by the verification unit 101 to be in the on state, and the electric power from the connecting unit 100 is transmitted to the laser source 103 through the on-state controlled switch unit 102 to illuminate the laser source (Step S3). On the other hand, if the failed verification result is detected by the verification unit 101, the controlled switch unit 102 is controlled by the verification unit 101 to be in the off state, so that the electric power fails to be transmitted to the laser source 103 through the off-state controlled switch unit 102 and the laser source 103 is turned off (Step S4).

From the above description, the present invention provides a laser light source module, a laser apparatus having the laser light source module, and a lighting method of the laser light source module. In a case that the driving energy is received by the laser light source module, the verification unit of the laser light source module will judge whether the verification signal complies with the predetermined verifying condition. Consequently, only when the verification result is successful, the electric power can be transmitted to the laser source through the on-state controlled switch unit in order to illuminate the laser source. That is, the laser light source module has a safe protection mechanism. After the laser light source module is detached from the laser apparatus, the laser light source module fails to be enabled to emit the light beams. As a consequence, the risk of using the laser light source module or the laser apparatus will be largely reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A laser light source module detachably assembled into a laser apparatus, said light source module comprising:
   a laser source;
   a connecting unit for receiving electric power required to operate said laser light source module, wherein said connecting unit comprises a first power-receiving port and a signal-receiving port;
   a controlled switch unit having a conducting terminal electrically connected between said laser source and said first power-receiving port; and
   a verification unit electrically connected with a control terminal of said controlled switch unit, said connecting unit and said signal-receiving port, and storing a predetermined verifying condition, wherein when a verification signal is received by said signal-receiving port, said verification unit judges whether said verification signal complies with said verifying condition, thereby determining on/off states of said controlled switch unit, wherein if said verification signal complies with said verifying condition, said controlled switch unit is controlled by said verification unit to be in said on state, so that a first output voltage from said first power-receiving port is transmitted to said laser source through said controlled switch unit to drive illumination of said laser source, and wherein if said verification signal does not comply with said verifying condition, said controlled switch unit is controlled by said verification unit to be in said off state, so that said first output voltage fails to be transmitted to said laser source through said controlled switch unit and said laser source is turned off, wherein said connecting unit further comprises a second power-receiving port, which is electrically connected with said verification unit for receiving a second output voltage required to operate said verification unit.

2. The laser light source module according to claim 1, wherein said controlled switch unit is a relay.

3. The laser light source module according to claim 1, wherein said connecting unit further comprises a third power-receiving port, which is electrically connected with said verification unit for receiving a third output voltage required to operate said controlled switch unit.

4. The laser light source module according to claim 3, wherein if said verification signal complies with said verifying condition, said third output voltage is transmitted to said control terminal of said controlled switch unit through said verification unit, so that said controlled switch unit is controlled to be in said on state, and wherein if said verification signal does not comply with said verifying condition, said third output voltage fails to be transmitted to said control terminal of said controlled switch unit through said verification unit, so that said controlled switch unit is controlled to be in said off state.

5. The laser light source module according to claim 1, wherein said verifying condition is predetermined according to a form or a type of said verification signal.

6. The laser light source module according to claim 5, wherein said verification signal is transmitted to said signal-receiving port through a general purpose input output interface, and said verification signal is switched between a high-level state and a low-level state.

7. The laser light source module according to claim 6, wherein if said verification signal in said high-level state, said verification signal complies with said verifying condition.

8. The laser light source module according to claim 5, wherein said verification signal is transmitted to said signal-receiving port through a universal asynchronous receiver/transmitter interface, and said verification signal contains an encoded code.

9. The laser light source module according to claim 8, wherein if said encoded code contained in said verification signal is acceptable by the verification unit, said verification signal complies with said verifying condition.

10. The laser light source module according to claim 1, wherein said laser light source module further comprises an interlock switch, an alarm unit and an alarm power source, which are electrically connected with each other in series and arranged between said controlled switch unit and said connecting unit, wherein when said laser light source module is detached from said laser apparatus, said the interlock switch is in an on state, so that a driving power from said alarm power source is transmitted to said alarm unit through the interlock switch to drive said alarm unit to emit a warning signal, wherein when said laser light source module is assembled into said laser apparatus, said interlock switch is in an off state, so that said driving power from said alarm power source fails to be transmitted to said alarm unit through the interlock switch and said warning signal is stopped.

11. A laser apparatus, comprising:
a driving circuit for converting an input voltage into plural output voltages, and outputting a verification signal; and
a laser light source module, powered and operated by said plural output voltages, and comprising:
a laser source;
a connecting unit detachably assembled into said driving circuit, wherein said connecting unit comprises a first power-receiving port for receiving a first output voltage of said plural output voltages and a signal-receiving port for receiving said verification signal;
a controlled switch unit having a conducting terminal electrically connected between said laser source and said first power-receiving port; and
a verification unit electrically connected with a control terminal of said controlled switch unit, said connecting unit and said signal-receiving port, and storing a predetermined verifying condition, wherein when a verification signal is received by said signal-receiving port, said verification unit judges whether said verification signal complies with said verifying condition, thereby determining on/off states of said controlled switch unit, wherein if said verification signal complies with said verifying condition, said controlled switch unit is controlled by said verification unit to be in said on state, so that a first output voltage from said first power-receiving port is transmitted to said laser source through said controlled switch unit to drive illumination of said laser source, and wherein if said verification signal does not comply with said verifying condition, said controlled switch unit is controlled by said verification unit to be in said off state, so that said first output voltage fails to be transmitted to said laser source through said controlled switch unit and said laser source is turned off, wherein said driving circuit comprises:
a ballast electrically connected with said connecting unit for converting said input voltage and outputting said plural output voltages; and
a system unit electrically connected with said ballast for enabling said ballast, adjusting an operating status of said ballast, and outputting said verification signal.

12. The light apparatus according to claim 11, wherein said system unit comprises:
a general purpose input output interface electrically connected with said ballast, wherein a start signal is transmitted from said system unit to said ballast through said general purpose input output interface, thereby determining whether said ballast is enabled, wherein said start signal is switched between a high-level state and a low-level state; and
a universal asynchronous receiver/transmitter interface electrically connected with said ballast, wherein an encoding signal containing an encoded code is transmitted from said system unit to said ballast through said universal asynchronous receiver/transmitter interface, thereby controlling said operating status of said ballast.

13. The light apparatus according to claim 12, wherein said general purpose input output interface is further electrically connected with said signal-receiving part for transmitting said start signal to said signal-receiving part, wherein said start signal is defined as said verification signal.

14. The light apparatus according to claim 12, wherein said universal asynchronous receiver/transmitter interface is further electrically connected with said signal-receiving part for transmitting said encoding signal to said signal-receiving part, wherein said encoding signal is defined as said verification signal.

15. A lighting method of a laser light source module, said laser light source module comprising a laser source, a connecting unit, a controlled switch unit and a verification unit, said connecting unit comprising a first power-receiving port, a second power-receiving port and a signal-receiving port, said controlled switch unit having a conducting terminal electrically connected between said laser source and said first power-receiving port, said verification unit being electrically connected with a control terminal of said controlled switch unit, said connecting unit and said signal-receiving port, said verification unit storing a predetermined verifying condition, said second power-receiving port is electrically connected with said verification unit for receiving a second output voltage required to operate said verification unit, said lighting method comprising steps of:

(a) receiving electric power required to operate said laser light source module through said connecting unit;
(b) allowing said verification unit to judge whether a verification signal received by said connecting unit complies with said verifying condition; and
(c) determining on/off states of said controlled switch unit, wherein if said verification signal complies with said verifying condition, said controlled switch unit is controlled by said verification unit to be in said on state, so that said electric power from said connecting port is transmitted to said laser source through said controlled switch unit to turn on said laser source.

16. The lighting method according to claim 15, wherein in said step (c), if said verification signal does not comply with said verifying condition, said controlled switch unit is controlled by said verification unit to be in said off state, so that said electric power fails to be transmitted to said laser source through said controlled switch unit and said laser source is turned off.

* * * * *